March 3, 1959

J. J. SURAN 2,876,355

WAVEFORM COMPENSATION NETWORKS

Filed July 26, 1955

INVENTOR:
JEROME J. SURAN,
BY George Beltgeth
HIS ATTORNEY.

United States Patent Office 2,876,355
Patented Mar. 3, 1959

2,876,355

WAVEFORM COMPENSATION NETWORKS

Jerome J. Suran, Syracuse, N. Y., assignor to General Electric Company, a corporation of New York Application July 26, 1955, Serial No. 524,565
5 Claims. (Cl. 250—36)

Figure 1:
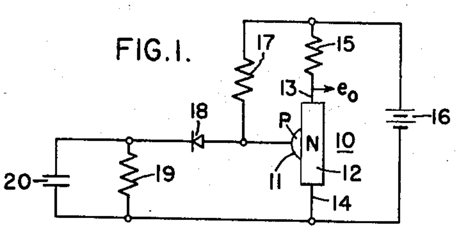

This invention relates to semiconductor signal generating circuits and more particularly to waveform compensating networks for signal generating circuits.

A recently issued U. S. patent entitled "Semiconductor Wave Generator" by E. Keonjian and J. J. Suran, U. S. Patent 2,801,340, dated July 30, 1957, which is assigned to the assignee of the present invention, discloses a new and improved semiconductor relaxation oscillator. The output waveform of the relaxation oscillator of this application may exhibit a sloping characteristic as a result of certain junction effects attributable to the cut-off state of the semiconductor device employed. It is an object of this invention to eliminate this effect by providing the aforesaid relaxation oscillator with waveform compensating networks.

Another object of this invention is to provide a new and improved rectangular waveform generator in which waveform distortion is suppressed in a simple and efficient manner.

These and other advantages of the invention will be more clearly understood from the following description taken in connection with the accompanying drawings and its scope will be apparent from the appended claims.

Figure 2:
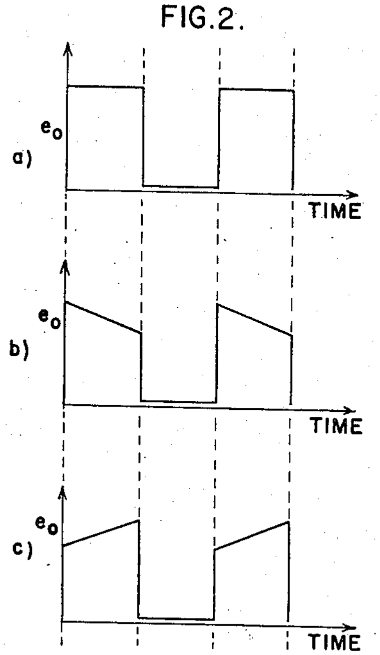
Figures 3, 4:
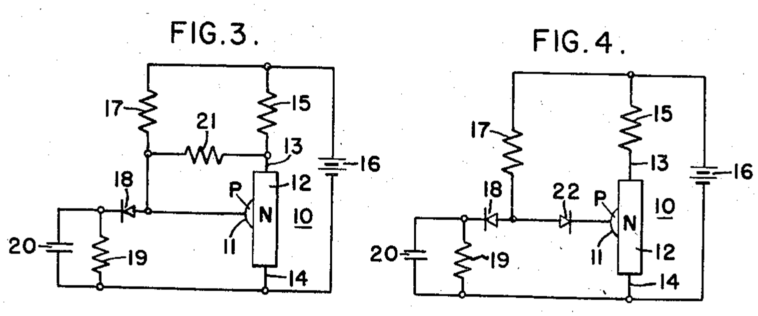

In the drawings:

Figure 1 is a schematic diagram of the relaxation oscillator circuit of the aforesaid copending application;

Figure 2*a* shows the idealized waveform which is desired to be generated from the circuit of Figure 1;

Figures 2*b* and 2*c* show waveforms with distortion which may be generated by the circuit shown in Figure 1;

Figure 3 is a diagrammatic illustration of one embodiment of this invention to provide compensation for the waveform distortion shown in Figure 2*b*; and Figure 4 is a diagrammatic illustration of another embodiment of this invention which eliminates the distortion shown in Figure 2*c*.

As is more fully described and claimed in the aforesaid U. S. Patent 2,801,340, dated July 30, 1957, the apparatus shown in Figure 1 utilizes the non-linear characteristic of semiconductor 10 in a relaxation oscillator circuit. Semiconductor 10 consists of a bar 12 of semiconducting material, such as N-type silicon or germanium, having ohmic electrodes 13 and 14 attached to spaced points thereon, and a rectifying junction 11 which consists of an indium dot fused to a portion of the bar 12 within a region affected by an electric field between electrodes 13 and 14. The electric field existing along the bar 12 is supplied by a source of potential 16 having one pole connected to ohmic contact 13 through a resistance 15 and the other pole directly connected to ohmic electrode 14. A resistance 17 is connected to a source of potential 16 and to the rectifying junction 11 of semiconductor 10. Diode 18 is connected to rectifying junction 11 of semiconductor 10 and to a resistance 19 which is connected to ohmic electrode 14 of semiconductor 10, poled to present easy flow to currents directed away from junction 11. A capacitance 20 is connected across resistance 19.

Assuming initially that the semiconductor 10 is biased in the cut-off region of its operating characteristic, capacitor 20 charges from source of potential 16 through resistance 17 and diode 18. During the charging cycle of capacitor 20, diode 18 is conducting but semiconductor 10 remains nonconducting. As the potential across capacitor 20 builds up equal to or greater than the peak point potential of semiconductor 10 (the potential required to make semiconductor 10 conductive), the latter becomes unstable and enters into its conducting state. When semiconductor 10 begins conducting, the potential at junction 11 drops to a relatively low value. Since the potential across capacitor 20 is greater than the potential of rectifying junction 11, diode 18 is cut off. Since diode 18 is in its nonconducting state, capacitor 20 is now isolated from semiconductor device 10, and thus discharges through resistance 19 until its potential is reduced to approximately equal the junction potential of semiconductor device 10. This biases diode 18 forwardly which causes it to become conducting again. This reverses the current flow through junction 11 of semiconductor 10, which is then driven into its cut-off state once more. The cycle becomes repetitive as capacitor 20 recharges to the peak point potential. For further details as to the operation of circuit of Figure 1, reference may be made to the aforesaid application.

A distortionless waveform such as shown in Figure 2*a* would be generated from the circuit shown in Figure 1 provided that semiconductor 10 is structurally nearly perfect. However, if semiconductor 10 is constructed such that the junction penetration into the bar 12 is deep, the depletion layer associated with the reversely-biased junction will affect the bar resistance of semiconductor 10. Thus, when semiconductor 10 is biased into its cut-off state, a variation of junction potential may cause a corresponding variation in bar resistance. For this condition, the resistance of bar 12 will vary directly with the back voltage across junction 11. In the circuit configuration of Figure 1, as capacitor 20 charges, during the cut-off state of semiconductor 10, the resistance of bar 12 will decrease. The output voltage $e_0$ across resistance 15 thus decreases during the positive cycle of the rectangular wave as is illustrated in Figure 2*b*. This distortion is referred to as the "transtriction effect." This effect is due to the transtricting action of the depletion layer associated with the inversely-biased junction and is similar to the resistance-modulation mechanism of the unipolar field effects transistor.

This transtriction effect may be compensated for by applying an external leakage path to the junction 11 of semiconductor 10. Figure 3 shows such a circuit in which a resistance 21 is connected between ohmic electrode 13 and junction 11 of semiconductor 10. Resistance 21 is used to apply a feed-back potential between capacitor 20 and ohmic electrode 13 of semiconductor 10. Current through resistance 21 decreases as capacitor 20 charges, providing an increasingly positive potential to appear across resistance 15. Since the transtrictor effect causes an increasingly negative potential across output resistance 15, resistance 21 compensates for distortion by maintaining a relatively flat wave. The magnitude of the compensating feed-back voltage supplied by resistance 21 may be adjusted by the variation of resistance 21 with respect to resistance 15.

Another junction effect which may lead to distortion is excessive leakage. This occurs when the back junction resistance of semiconductor 10 is of the same order of magnitude as the external resistance 17. With this condition, a considerable part of the current which charges capacitor 20 flows through the reversely-biased junction 11 of semiconductor 10. As the potential across capacitor 20 increases, the charging current decreases exponentially. Consequently, the output voltage $e_0$ across resistance 15 increases, providing a waveform such as illustrated in Figure 2*c*. This output waveform has a positive cycle which increases in potential as the capacitor 20 charges. Waveform distortion of this type is referred to as the "leakage effect."

The leakage effect is compensated for by using an auxiliary diode in series with the junction 11 of semiconductor 10, as is illustrated in the circuit of Figure 4. In Figure 4, diode 22 is connected in series with junction 11 of semiconductor 10. Diode 22 is connected such that its easy direction of current flow is toward junction 11. Consequently, the back resistance of diode 22 effectively isolates resistance 15 from the potential across capacitor 20 regardless of the leakage current associated with the junction 11 of semiconductor 10. However, as capacitor 20 discharges and semiconductor 10 is conducting, diode 22 is biased forwardly and its circuit effect is negligible.

The compensating techniques embodied in this invention eliminate distortion in the output waveform of a rectangular wave generator. Transtriction or leakage effects associated with the cut-off state of a single junction semiconductor device are compensated for by the addition of a single resistor or a single diode, respectively, providing a simple and efficient compensating means. These compensating techniques can be employed in other circuits using semiconductor devices of the type utilized by this invention, as for example, in monostable and bistable networks. Although semiconductor device 10 is shown and described having a P–N junction, it will appear obvious to those skilled in the art that a N–P junction may be used by reversing the polarities of the biasing potential.

Since other modifications varied to fit particular operating requirements and environments will be apparent to those skilled in the art, the invention is not considered limited to the examples chosen for purposes of disclosure and covers all changes and modifications which do not constitute departures from the true spirit and scope of this invention.

What I claim as new and desire to secure by Letters Patent of the United States is:

1. In a wave generating circuit, a semiconductor device having a single rectifying junction and at least two ohmic electrodes, impedance means, said impedance means connected between one of said electrodes and a potential source, a resistance-capacitance network, a circuit including a diode for connecting said resistance-capacitance network across said rectifying junction and another of said ohmic electrodes, a resistance connected across said rectifying junction and said one of said electrodes for providing a feedback path for said semiconductor device.

2. In a wave generating network, a semiconducting body having at least two spaced ohmic electrodes and a rectifying junction associated therewith in a region affected by an electric potential existing between said ohmic electrodes, a source of electric energy, means connecting a first pole of said source with a first one of said ohmic electrodes, a first resistance connecting a second pole of said source with a second one of said ohmic electrodes, an electric storage device connected between said junction and one of said ohmic electrodes, a second resistance connected between said second pole of said source and said junction, and a third resistance connected between said second ohmic electrode and said junction.

3. In an electric wave translating circuit, the combination of a semiconducting body having at least first and second spaced ohmic electrodes and a rectifying junction associated therewith in a region affected by an electric potential existing between said electrodes; a source of potential having a first and a second terminal; means connecting said first terminal to said first ohmic electrode; a first resistance, means connecting said first resistance between the second terminal and said second ohmic electrode; a second resistance, means connecting said second resistance between said rectifying junction and said second terminal; a unilaterally conducting device, a third resistance, means connecting said unilateral conducting device between said rectifying junction and said third resistance, means connecting said third resistance to said first ohmic electrode; a capacitance, means connecting said capacitance across said third resistane, and a fourth resistance, and means connecting said fourth resistance between said second ohmic terminal and said rectifying junction.

4. In a wave generating circuit including a semiconductor device having a single rectifying junction and at least first and second ohmic electrodes, said first electrode being connected to one pole of a source of electric potential; first resistance means, said second electrode being connected through said first resistance means to another pole of a source of electric potential; a network, said network being connected between said rectifying junction and said first electrode so as to maintain said semiconductor device in conduction for a first period and cut off for a second period, whereby said second electrode is maintained at a fixed potential during said second period; and means to stabilize said fixed potential comprising second resistive means, said second resistive means connected from said rectifying junction to said second electrode.

5. In a wave generating circuit including a semiconductor device having a single rectifying junction and at least first and second ohmic electrodes, said first electrode being connected to one pole of a source of electric potential; first resistance means, said second electrode being connected through said first resistance means to another pole of a source of electric potential, a network, said network being connected between said rectifying junction and said first electrode; said network including an impedance, said impedance being connected between said other pole of electric potential and said rectifying junction, said network cooperating with said device so as to keep the latter in conduction for a first period and cut off for a second period, whereby said second electrode is maintained at a fixed potential during said second period; and means to stabilize said fixed potential comprising second resistive means, said second resistive means being connected from said junction to said second electrode and passing a current so as to compensate for impedance variations within said semiconductor device.

References Cited in the file of this patent

UNITED STATES PATENTS 2,801,340 Keonjian et al. ---------- July 30, 1957

OTHER REFERENCES

"The Double Base Diode," by Lesk et al.; 1953 IRE Convention Record, part 6, pp. 2–8.

"Principles of Transistor Circuits," by Shea, John Wiley and Sons, New York, N. Y. pp. 460–471, 1953.